(12) United States Patent
Wadensweiler et al.

(10) Patent No.: US 7,290,976 B2
(45) Date of Patent: Nov. 6, 2007

(54) SEMICONDUCTOR SUBSTRATE PROCESSING APPARATUS WITH A PASSIVE SUBSTRATE GRIPPER

(75) Inventors: Ralph M. Wadensweiler, Sunnyvale, CA (US); Rick R. Endo, San Carlos, CA (US); Alexander S. Ko, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 224 days.

(21) Appl. No.: 11/168,225

(22) Filed: Jun. 28, 2005

(65) Prior Publication Data

US 2006/0291990 A1  Dec. 28, 2006

(51) Int. Cl.
*B25J 15/00* (2006.01)
(52) U.S. Cl. ............... 414/590; 294/1.1; 414/800; 414/808; 414/815
(58) Field of Classification Search ........... 414/941, 414/776, 779, 782, 783, 784, 590, 744.5, 414/800, 808, 815, 680, 729; 294/1.1
See application file for complete search history.

(56) References Cited

U.S. PATENT DOCUMENTS

2006/0113806 A1*  6/2006  Tsuji et al. ............... 294/1.1

* cited by examiner

*Primary Examiner*—Donald Underwood
(74) *Attorney, Agent, or Firm*—Blakely Sokoloff Taylor & Zafman

(57) ABSTRACT

According to one aspect of the present invention, a passive substrate gripper, including first and second segments, is provided. The second segment may be connected to the first segment, and the first and second segments may jointly form a substrate support. The substrate support may be shaped to support a substrate in first position within the substrate support when the substrate support is in a first angular orientation. The substrate may be removable from substrate support in a first direction when in the first position. The substrate may move into a second position when the substrate support is moved into a second angular orientation. The substrate may not be removable in the first direction when in the second position within the substrate support. The passive substrate gripper may also include a support ledge extending from opposing inner surfaces of the first and second segments, on which the substrate is supported.

15 Claims, 22 Drawing Sheets

SEMICONDUCTOR SUBSTRATE PROCESSING APPARATUS WITH A PASSIVE SUBSTRATE GRIPPER

BACKGROUND OF THE INVENTION

1). Field of the Invention

This invention relates to a method and apparatus for transporting semiconductor substrates, in particular, to a method and apparatus for transporting semiconductor substrates between processing modules within a semiconductor substrate processing system.

2). Discussion of Related Art

Integrated circuits are formed on semiconductor substrates, such as wafers. The wafers are then sawed (or "singulated" or "diced") into microelectronic dice, also known as semiconductor chips, with each chip carrying a respective integrated circuit, or device. Each semiconductor chip is then mounted to a package, or carrier, substrate. The packages are often mounted to a circuit board, which may be installed in a computer.

Numerous steps may be involved in the creation of the integrated circuits, such as the formation and etching of various semiconducting, insulating, and conducting layers, as well as cleaning the substrates between the formation of these various layers. The systems used for processing the semiconductor substrates often include several different types processing modules. In order for the substrates to be processed by each different type of module, the substrates must be transported between the modules.

Typically, the substrates are transported between the modules by robots that include substrate, or wafer, grippers, or "active end effectors" to "grab" the substrate from one module and place the substrate in the next module. The wafer grippers often have moving parts which in order to securely grip the substrates must contact, or touch, the upper, or "device," surface of the substrate and/or the lower, or "non-device," surface of the substrate.

This contact with the upper and lower surfaces of the substrates often leads to the devices being contaminated and damaged during transportation between the various processing modules. Additionally, the moving parts of the grippers add to the costs of the systems, thus increasing the costs of manufacturing the integrated circuits. Furthermore, repeated exposure to semiconductor processing liquids, such as deionized water and other chemicals, can damage the moving parts, which increases the maintenance costs of the systems.

SUMMARY OF THE INVENTION

The invention provides a passive substrate gripper including a first segment and a second segment. The second segment may be connected to the first segment, and the first and second segments may jointly form a substrate support. The substrate support may be shaped to support a substrate in first position within the substrate support when the substrate support is in a first angular orientation. The substrate may be removable from substrate support in a first direction when in the first position. The substrate may move into a second position when the substrate support is rotated into a second angular orientation. The substrate not being removable in the first direction when in the second position within the substrate support. The passive substrate gripper may also include a support ledge extending from opposing inner surfaces of the first and second segments, on which the substrate is supported.

BRIEF DESCRIPTION OF THE DRAWINGS

The invention is described by way of example with reference to the accompanying drawings wherein.

DETAILED DESCRIPTION OF THE INVENTION

FIG. 1 to FIG. 8 illustrate a semiconductor substrate processing system including a passive substrate gripper. The passive substrate gripper may include a first segment and a second segment. The second segment may be connected to the first segment, and the first and second segments may jointly form a substrate support. The substrate support may be shaped to support a substrate in first position within the substrate support when the substrate support is in a first angular orientation. The substrate may be removable from substrate support in a first direction when in the first position. The substrate may move into a second position when the substrate support is rotated into a second angular orientation. The substrate not being removable in the first direction when in the second position within the substrate support. The passive substrate gripper may also include a support ledge extending from opposing inner surfaces of the first and second segments, on which the substrate is supported.

It should be noted that FIGS. 1A through 8 are merely illustrative and may not be drawn to scale.

Figure 1A:
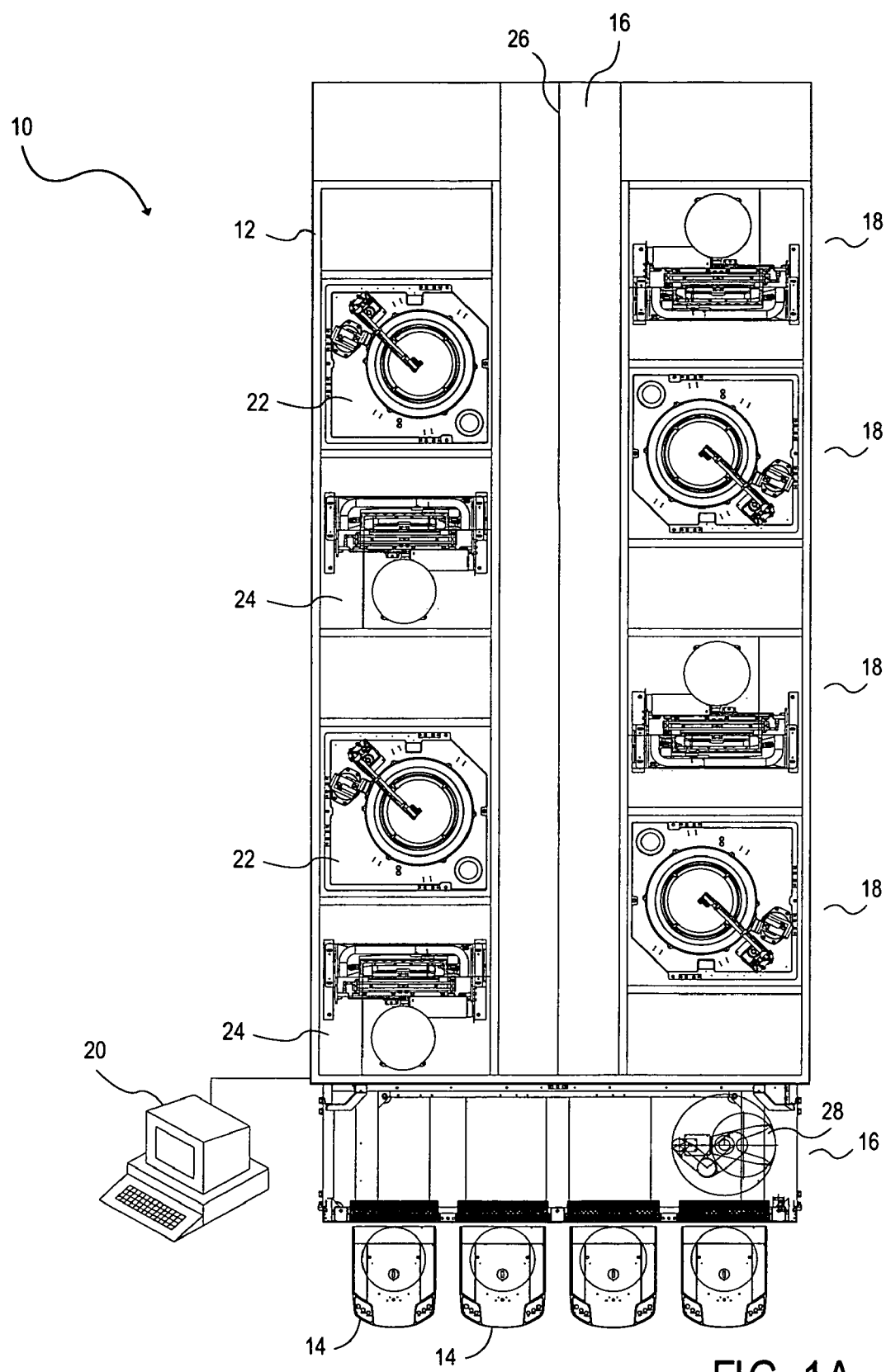
FIG. 1A is a top plan view of a semiconductor substrate processing system.
Figure 1B:
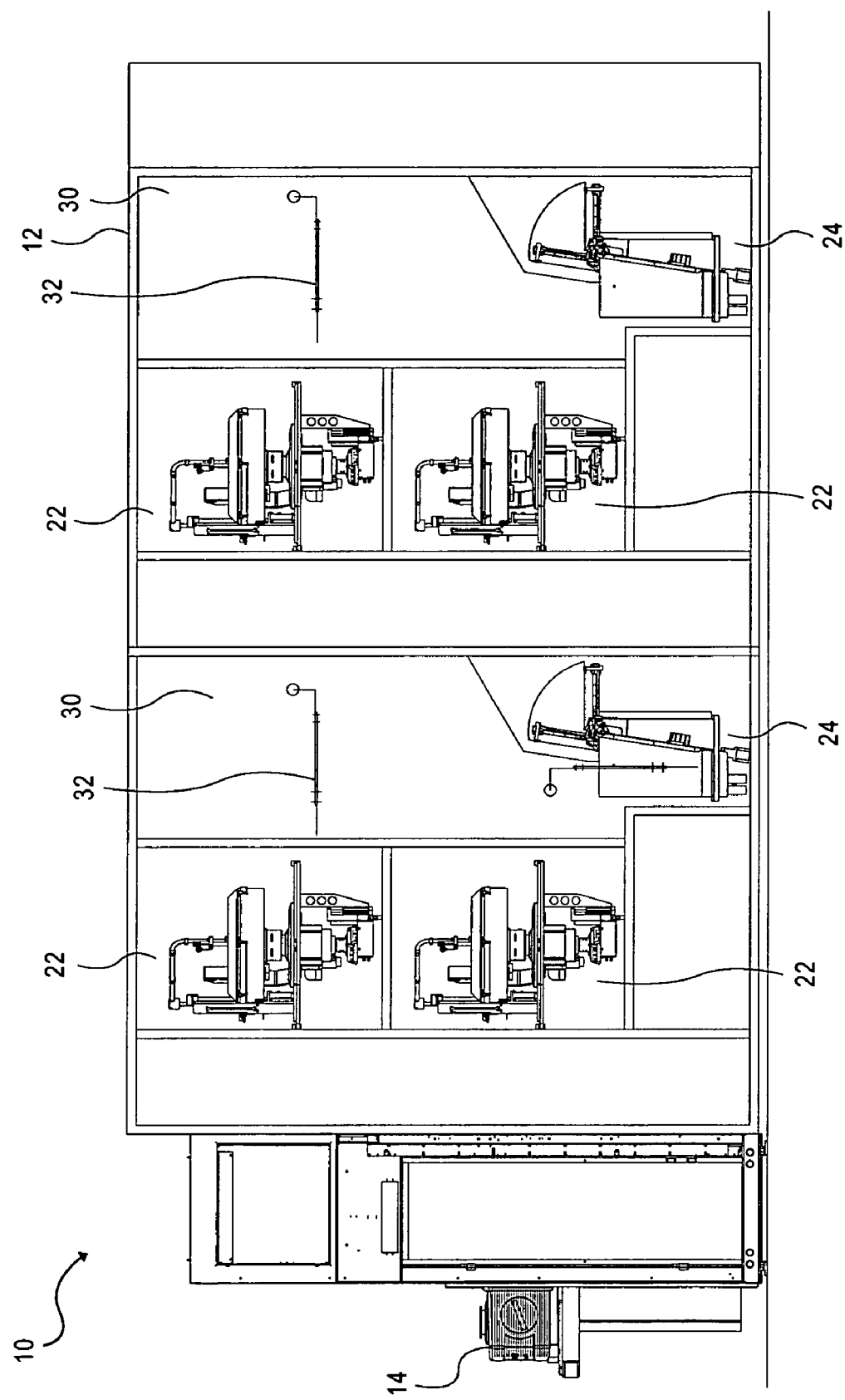
FIG. 1B is a cross-sectional side view of the semiconductor substrate processing system of FIG. 1A.

FIGS. 1A and 1B illustrate a semiconductor substrate processing system 10, according to one embodiment of the present invention. The substrate processing system 10 may include a frame 12, substrate cassettes 14, a transport subsystem 16, substrate processing modules 18, and a computer control console 20. The frame 12 may be substantially rectangular with the cassette 14 attached at a first end thereof. The transport subsystem 16 may have a first portion that lies along the end of the frame 12 near the cassettes 14 and a second portion that lies at a central portion of the frame 12. The substrate processing modules 18 may be arranged on opposing sides of the second portion of the transport subsystem 16.

The substrate cassettes 14 may lie at one end of the frame 12 and may be Front Opening Unified pods (FOUPs), as is commonly understood in the art. The cassettes 14 may be sized and shaped to hold and store a plurality of semiconductor substrates, such as wafers, with diameters of, for example, 200 or 300 millimeters.

The substrate processing modules 18 may include substrate cleaning apparatuses, such as spin clean chambers 22 and vertical immersion clean chambers 24. In the example illustrated in FIGS. 1A and 1B, there are eight spin clean chambers 22 and four vertical immersion clean chambers 24. As illustrated, the substrate processing modules may be arranged in "groups," with each group containing two spin clean chambers 22 and one vertical immersion clean chamber 24. The two spin clean chambers 22 in each group may be stacked with one spin clean chamber of each respective group placed directed above the other spin clean chamber 22 in the same group.

The transport subsystem 16, or mechanism, may include a robot track 26, a transport robot 28, and a plurality of module robots 30. The robot track 26 may lie within the frame 12 and extend from the first end of the frame 12 near the substrate cassettes 14, to a second end of the frame 12 which opposes the substrate cassettes 14. The transport robot 28 may be movably attached to the robot track 26 and may include a robot arm and a substrate support.

Referring specifically to FIG. 1B, each module robot 30 may be associated with a respective group of the substrate processing modules 18. The module robots 30 may each be connected to the frame 12 and positioned adjacent to the spin clean chambers 22 and above the vertical immersion clean chamber 24 of each group of modules. Each module robot 30 may include a passive substrate gripper 32, which will be described in greater detail below. Although not illustrated for clarity, each module robot 30 may also include a plurality of actuators for moving a substrate between the spin clean chambers 22 and the vertical immersion clean chamber 24 within each group, as well as rotating the passive substrate gripper 32.

The computer control console 20 may be in the form of a computer having a memory for storing a set of instructions and a processor connected to the memory for executing the instructions, as is commonly understood in the art. The computer control console 20 may be electrically connected to the cassettes 14, the substrate processing modules 18, and the transport subsystem 18.

Figure 2:
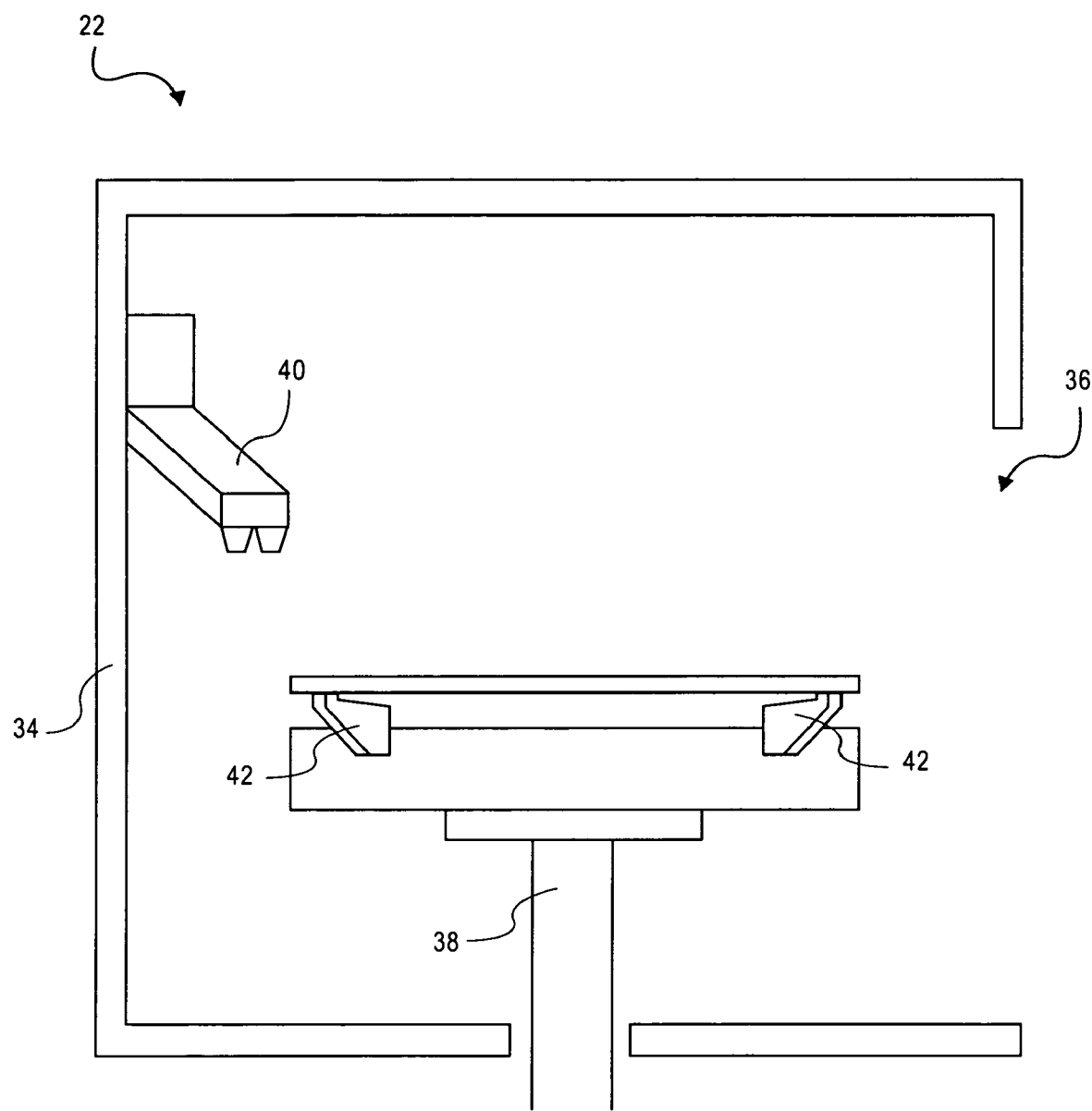
FIG. 2 is a cross-sectional schematic view of a spin clean chamber within the processing system illustrated in FIG. 1A.

FIG. 2 illustrates one of the spin clean chambers 22. The spin clean chamber 22 may include a chamber wall 34 with a substrate slit 36, or opening, therein, a substrate support 38, or wafer chuck, and a dispense head 40. The chamber wall 34 may be, in cross-section, substantially square with the opening 36 in a side of the chamber wall 34 adjacent to the module robot 30 as illustrated in FIG. 1B. The wafer chuck 38 may be connected to the frame 12 and extend upwards through a low portion of the chamber wall 34 and be sized to support, for example, semiconductor substrates, such as wafers with diameters of 200 or 300 millimeters. The wafer chuck 38 may be attached to the frame such that it is capable of rotating, or spinning, a semiconductor substrate at various rates between 1 revolution per minute (rpm) and 3000 rpm. The wafer chuck 38 may also include a plurality of posts 42 for supporting outer portions of a substrate placed thereon. The dispense head 40 may be connected to an upper portion of the chamber wall 34 and be capable of rotating to a position over a substrate supported on the wafer chuck 38. The dispense head 40, although not illustrated in detail, may be connected to a semiconductor processing fluid source, as is commonly understood in the art.

Figure 3:
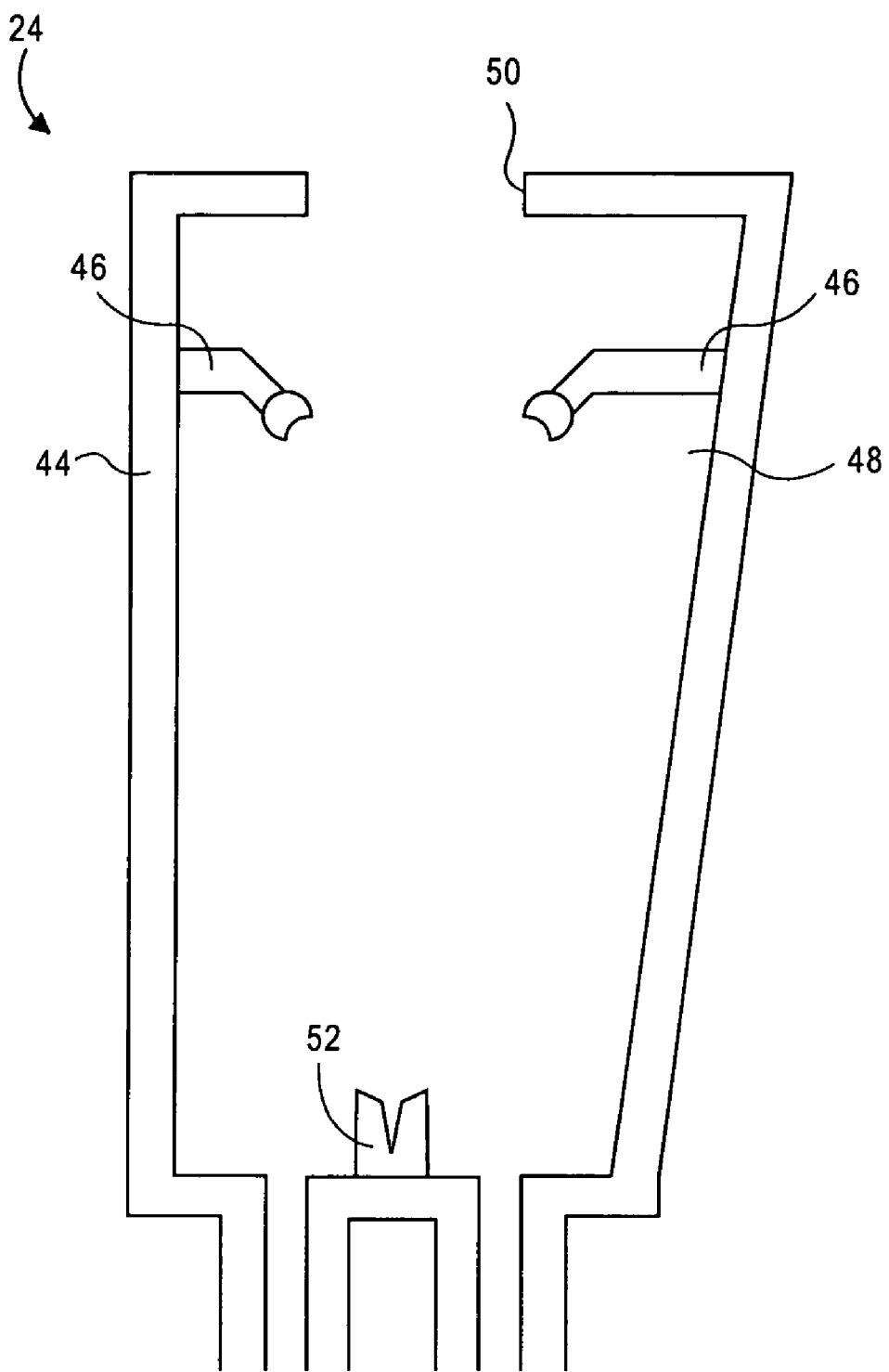
FIG. 3 is a cross-sectional schematic view of a vertical immersion clean chamber within the processing system illustrated in FIG. 1A.

FIG. 3 illustrates one of the vertical immersion clean chambers 24. The vertical immersion clean chambers 24 may include a main body 44, with vapor nozzles 46, a liquid tank 48 therein, a substrate opening 50 at an upper end thereof, and a substrate holder 52 at a lower end thereof within the liquid tank 48. Although not illustrated, it should be understood that the vapor nozzles 46 may be connected to a semiconductor processing vapor source. The substrate holder 52 may be shaped to hold a semiconductor substrate, such as wafer with a diameter of, for example, 200 or 300 mm, in a vertical orientation within the liquid tank 48.

Figure 4A:
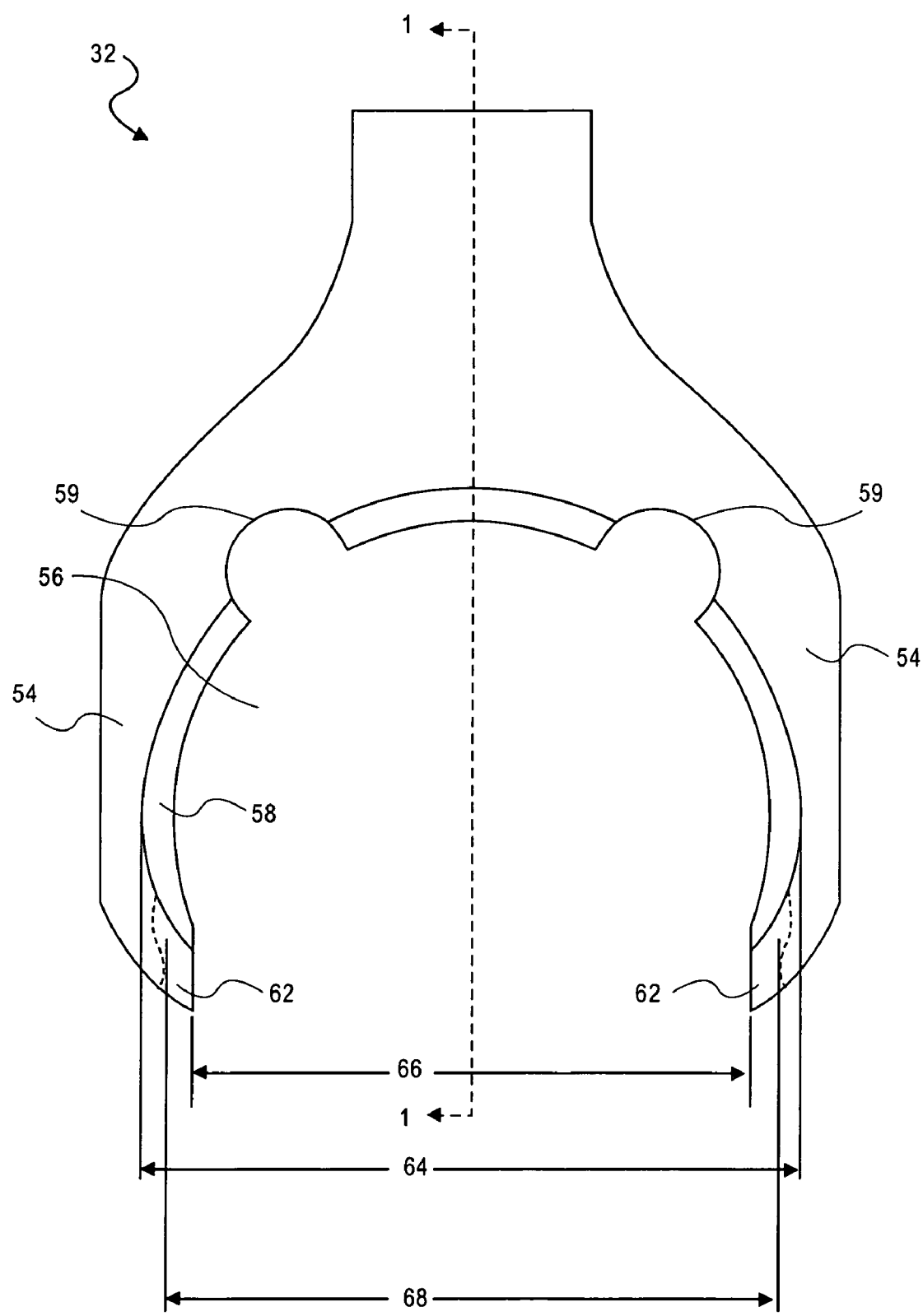
FIG. 4A is a top plan view of a passive substrate gripper within the processing system illustrated in FIG. 1A.
Figure 4B:
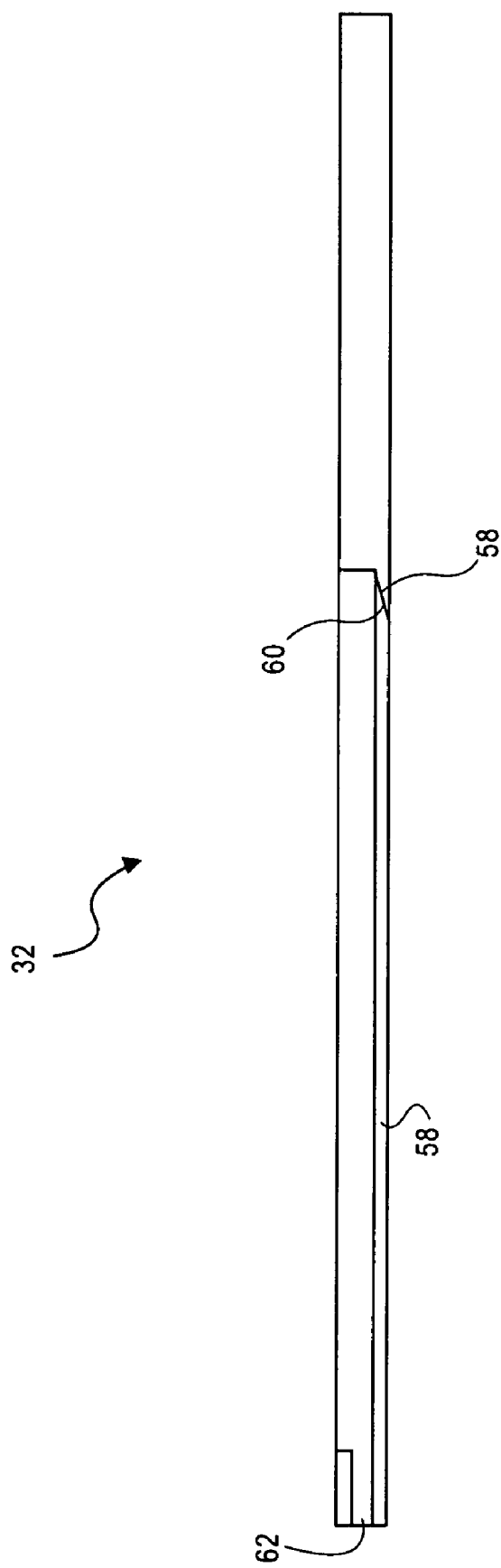
FIG. 4B is a cross-sectional side view on 1-1 in FIG. 4A of the passive substrate gripper.

FIGS. 4A and 4B illustrate one of the passive grippers 32 of one of the module robots 30 illustrated in FIG. 1B. The passive gripper 32 may include first and second arms, or segments 54, connected at first ends thereof that define a substrate space, or a substrate support 56, therebetween. An inner surface of the segments 54 and/or the substrate space 56 may have a support ledge 58 extending therefrom. The inner surface of the segments may also have two post notches 59.

As illustrated specifically in FIG. 4B, the support ledge 58 may run along a lower edge of the passive gripper 32 and have an angled upper surface 60. Each segment 54 may also include a substrate groove 62 at a second end thereof with an upper and a lower portion. The lower portion of the substrate groove 62 may be defined by the support ledge 58.

Referring again to FIG. 4A, opposing inner surfaces of the substrate space 56 may have a maximum width, or diameter 64, of, for example, 310 millimeters. Opposing inner edges of the support ledge 58 may have a maximum diameter 66 of, for example, 290 millimeters. Opposing inner surfaces of the grooves 62 may have a diameter 68 of, for example, 295 millimeters. The support ledge 58, along with the opposing inner surfaces of the substrate space 56 may form a recess in which a substrate may be placed and supported, as will be described in greater detail below.

The passive gripper 32 may be made from a single, integral piece of material, such as, for example, polyetherketone, semi-crystalline thermoplastic polyester, or unfilled acetal. The passive gripper 32 may also not include any moving parts, such as active substrate grippers which grip substrates by contacting the upper ("device") or lower ("non-device") surfaces of the substrates. It should also be noted that the various diameters 64, 66, and 68 may vary depending upon the size of the substrate that is to be processed. As will be appreciated by one skilled in the art, the diameters 64, 66, and 68 illustrated in FIG. 4A are appropriate for processing a semiconductor wafer with a diameter of approximately 300 mm.

In use, referring to FIGS. 1A and 1B, a plurality of semiconductor substrates, such as wafers with diameters of approximately 300 mm, may be inserted into the substrate cassettes 14. The computer control console 20 may control the various components of the substrate processing system 10 to process the semiconductor substrates as is described below.

The transport robot 28 may move along the robot track 26 to retrieve one of the substrates from the cassettes 14. The transport robot 28 may then transport the substrate into one of the spin clean chambers 22 and place the substrate on the wafer chuck 28 therein.

Figure 5A:
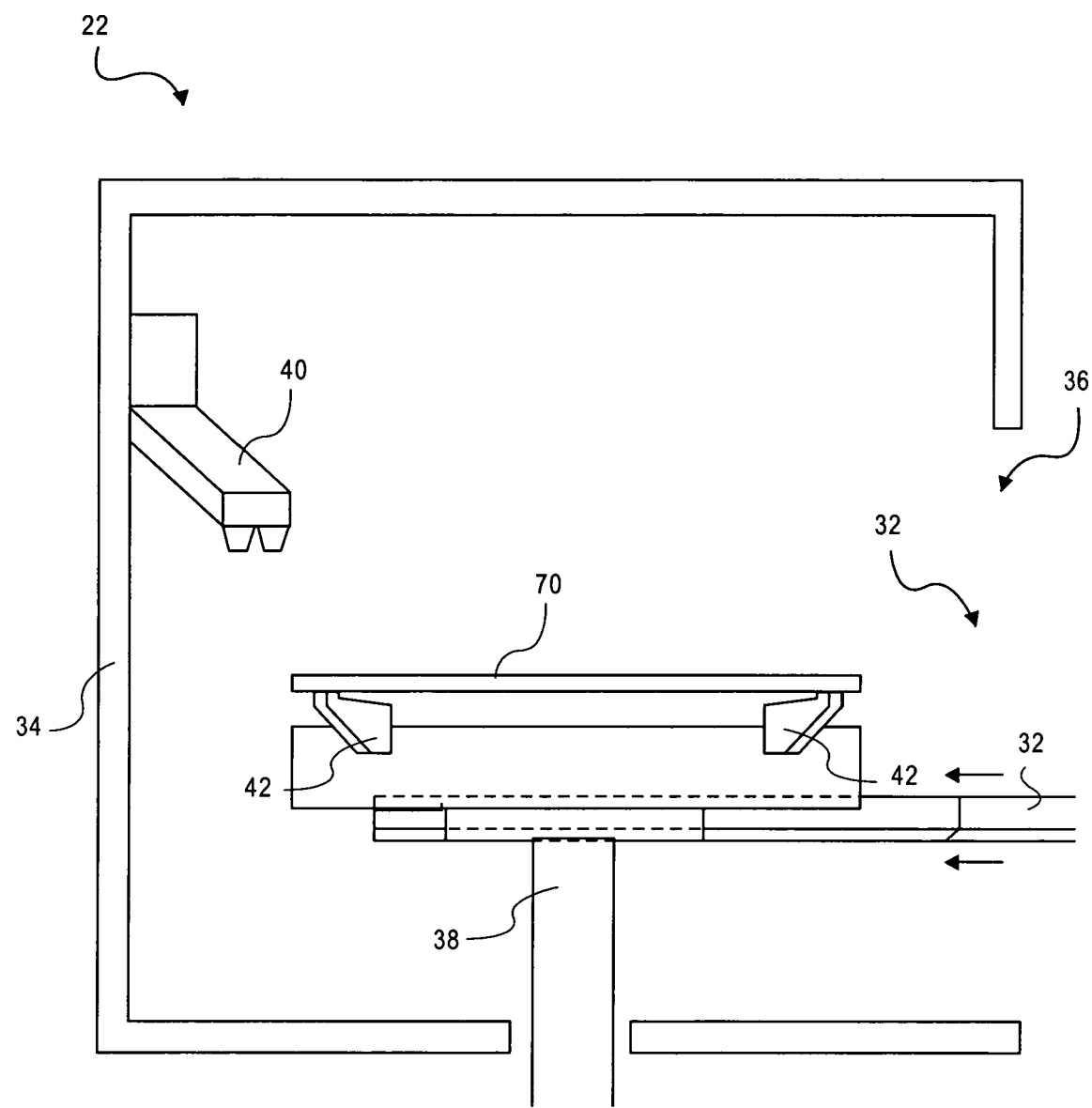
FIGS. 5A-5D illustrate the passive substrate gripper retrieving a semiconductor substrate from the spin clean chamber, FIGS. 5A, 5C, and 5D being cross-sectional sides views of the spin clean chamber and FIG. 5B being a top plan view of the passive substrate gripper.
Figure 5B:
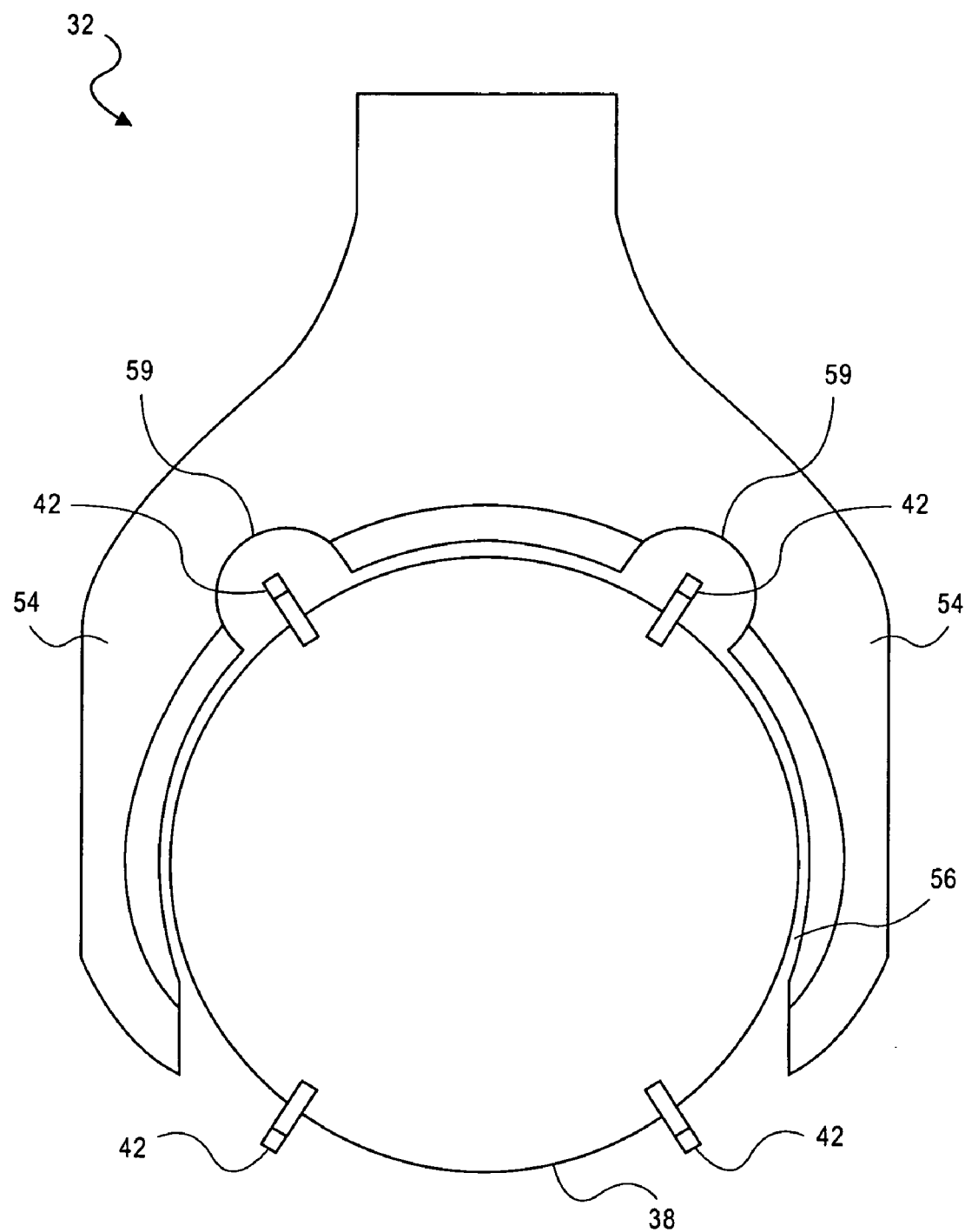

FIG. 5A illustrates the spin clean chamber 22 with a semiconductor substrate 70 placed on the wafer chuck 38. As is commonly understood in the art, the substrate 70 may undergo a spin cleaning process in which the substrate 70 is spun, or rotated, by the wafer chuck 38 while the dispense head 40 dispenses a semiconductor substrate processing liquid on an upper surface thereof.

Figure 5C:
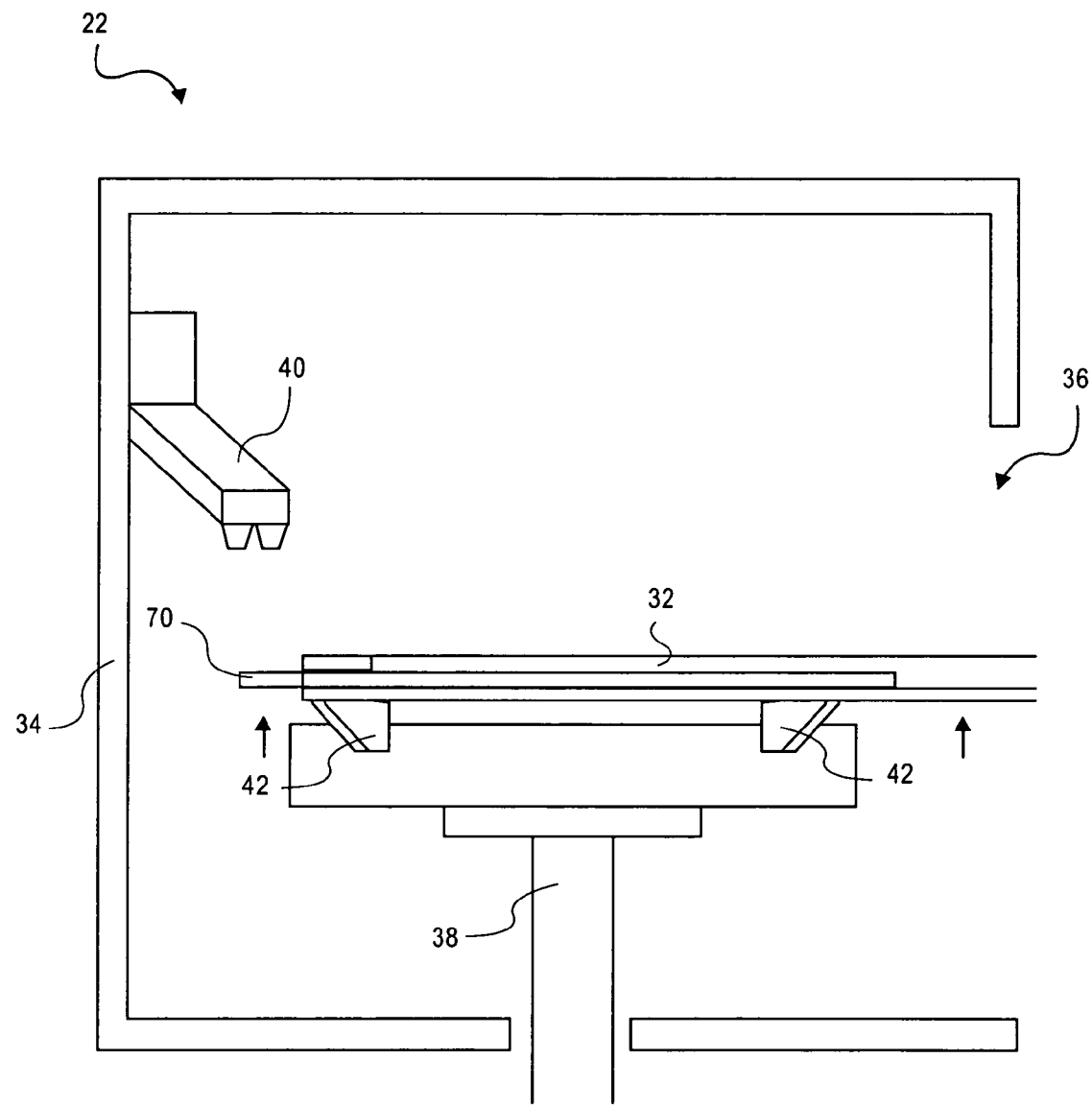
Figure 5D:
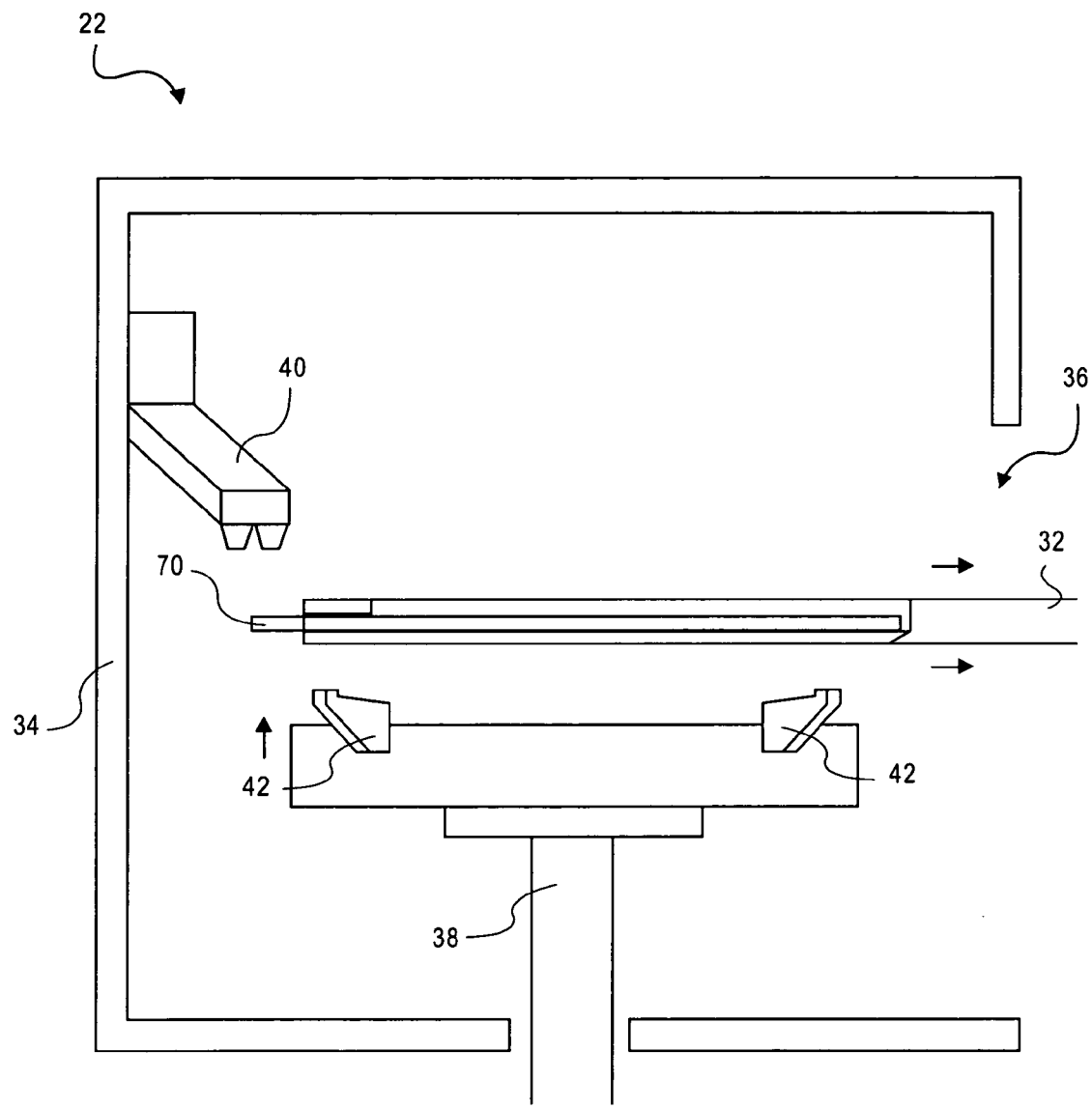
Figure 6A:
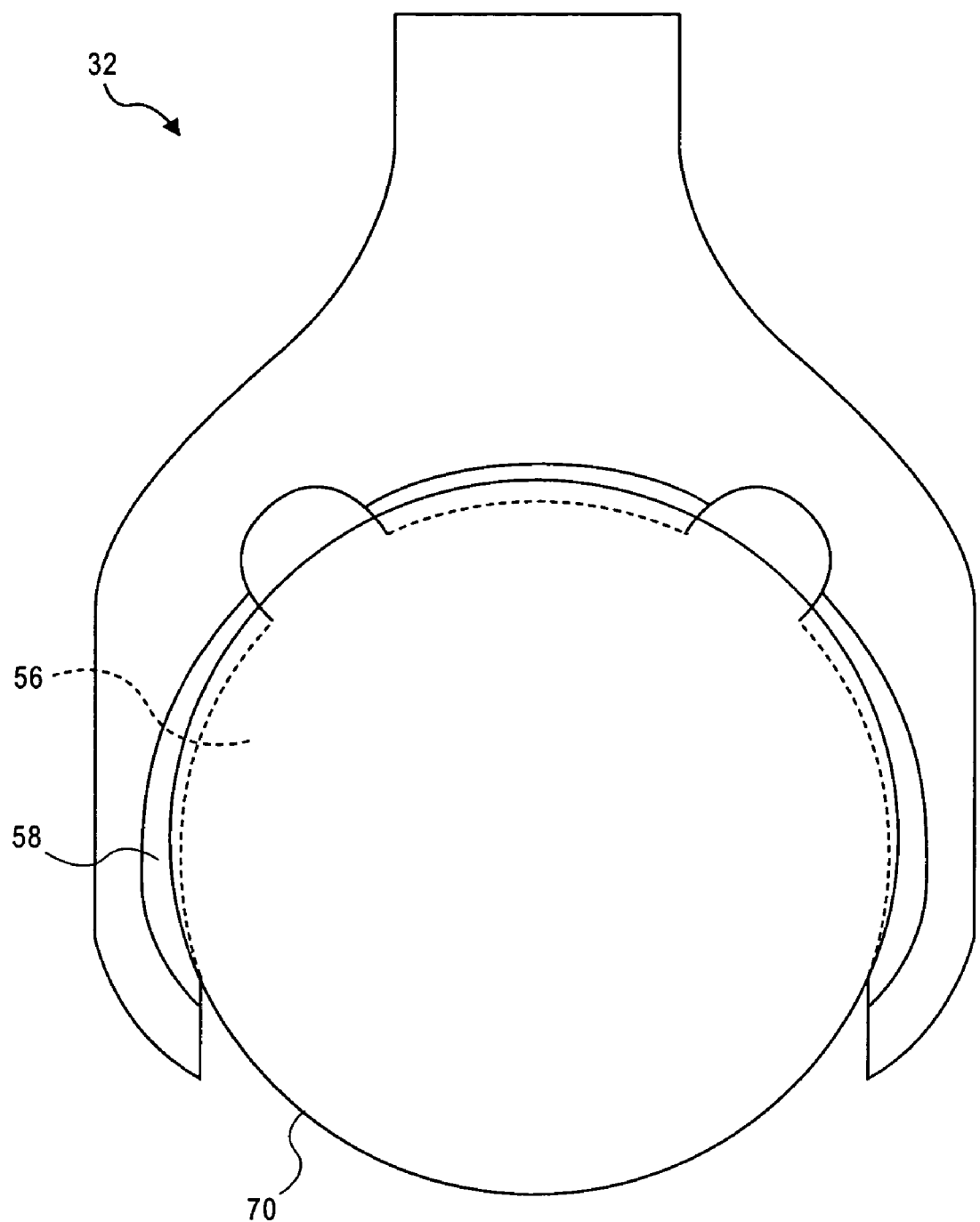
FIG. 6A is a top plan view of the passive substrate gripper with the semiconductor substrate placed thereon in a first position.

When the spin cleaning process is complete, the module robot may move the passive gripper 32 into the spin clean chamber 22 through the opening 36. As illustrated in FIG. 5A, the passive gripper 32 may enter the spin clean chamber 22 at a height lower than the substrate 70 and in a first, or substantially horizontal, angular orientation. As shown specifically in FIG. 5B, each of the segments 54 of the passive gripper 32 are on opposing sides of the wafer chuck 38 such that the wafer chuck 38 is positioned within the substrate space 56 and two of the posts 42 are within the posts notches 59. Then, as illustrated in FIGS. 5C and 5D, the passive gripper 32 may be moved upwards so that the substrate 70 is "caught" by the support ledge 58 and/or the substrate support 56 of the passive gripper 32 as illustrated in FIGS. 6A. Referring again to FIG. 5D, after the substrate 70 has been lifted from the wafer chuck 38 by the passive gripper 32, the passive gripper 32 may then be removed through the spin clean chamber 22 through the opening 36.

Referring again to FIG. 6A, after the substrate 70 has been lifted by the passive gripper 32, the substrate 70 may be in a first, or "unrestrained," position on the support ledge 58 of the passive gripper 32. In the unrestrained position illustrated, the substrate 70 may be merely supported by the support ledge 58 and could be lifted from the support ledge 58 without restriction from any part of the passive gripper 32. Thus, when in the unrestrained position, the substrate 70 may be removed from the passive gripper 32 if moved in a direction parallel to the arrows shown in FIG. 5C. Likewise, the substrate 70, when in the unrestrained position, may be removed from the passive gripper 32 if moved in a direction away from the page on which FIG. 6A is shown. In the embodiment illustrated, the direction in which the substrate 70 may be removed from the unrestrained position may be substantially perpendicular to the upper surface of the substrate.

Although not illustrated in detail, while the substrate 70 is in the unrestrained position, only the corner edges of the substrate 70 may contact the passive gripper 32. Neither the upper or lower surface thereof may contact the passive gripper 32 due to the angled upper surface 60 of the support ledge 58.

Figure 6B:
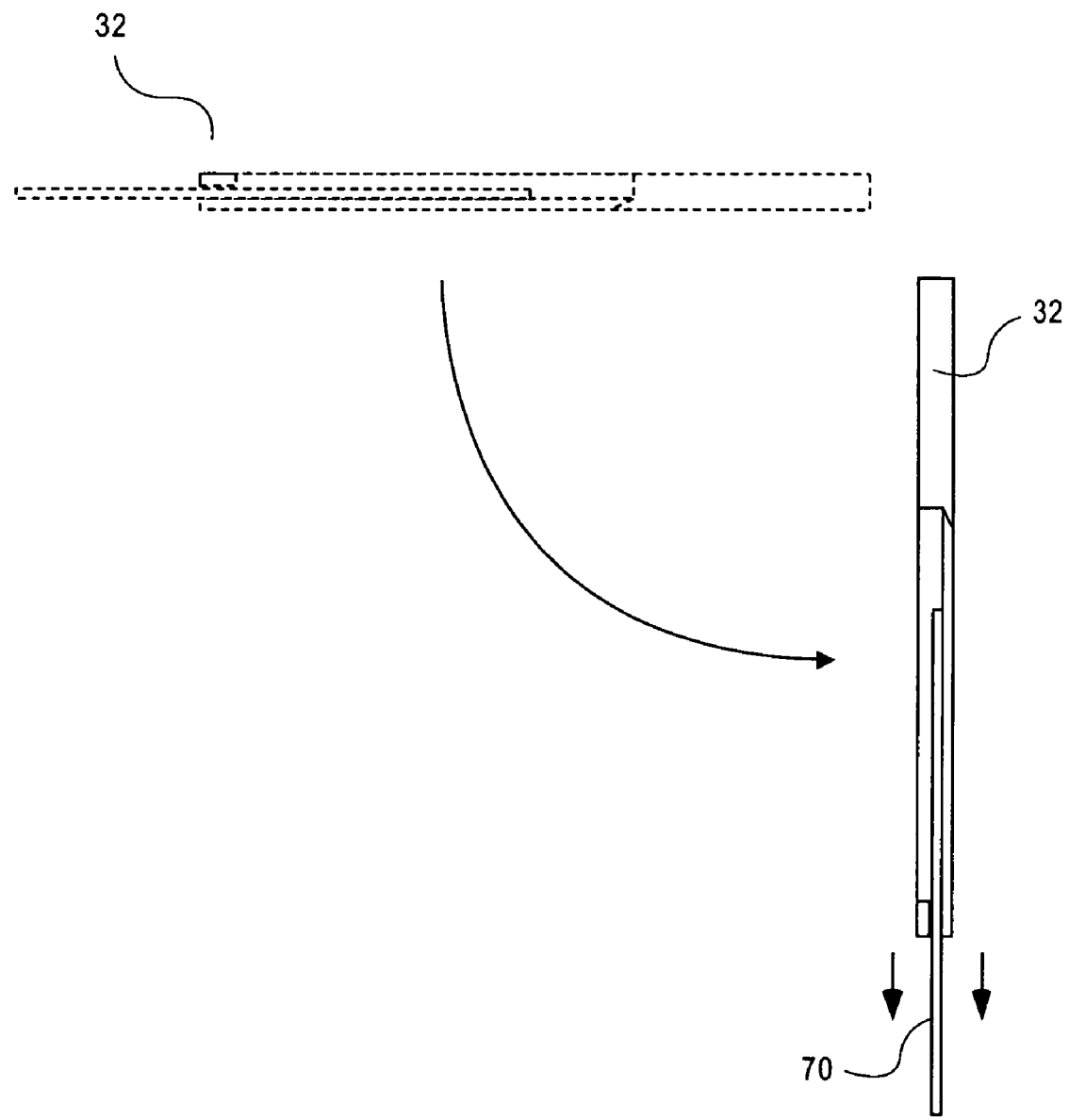
FIG. 6B is a cross-sectional side view of the passive substrate gripper illustrating the rotation thereof.
Figure 6C:
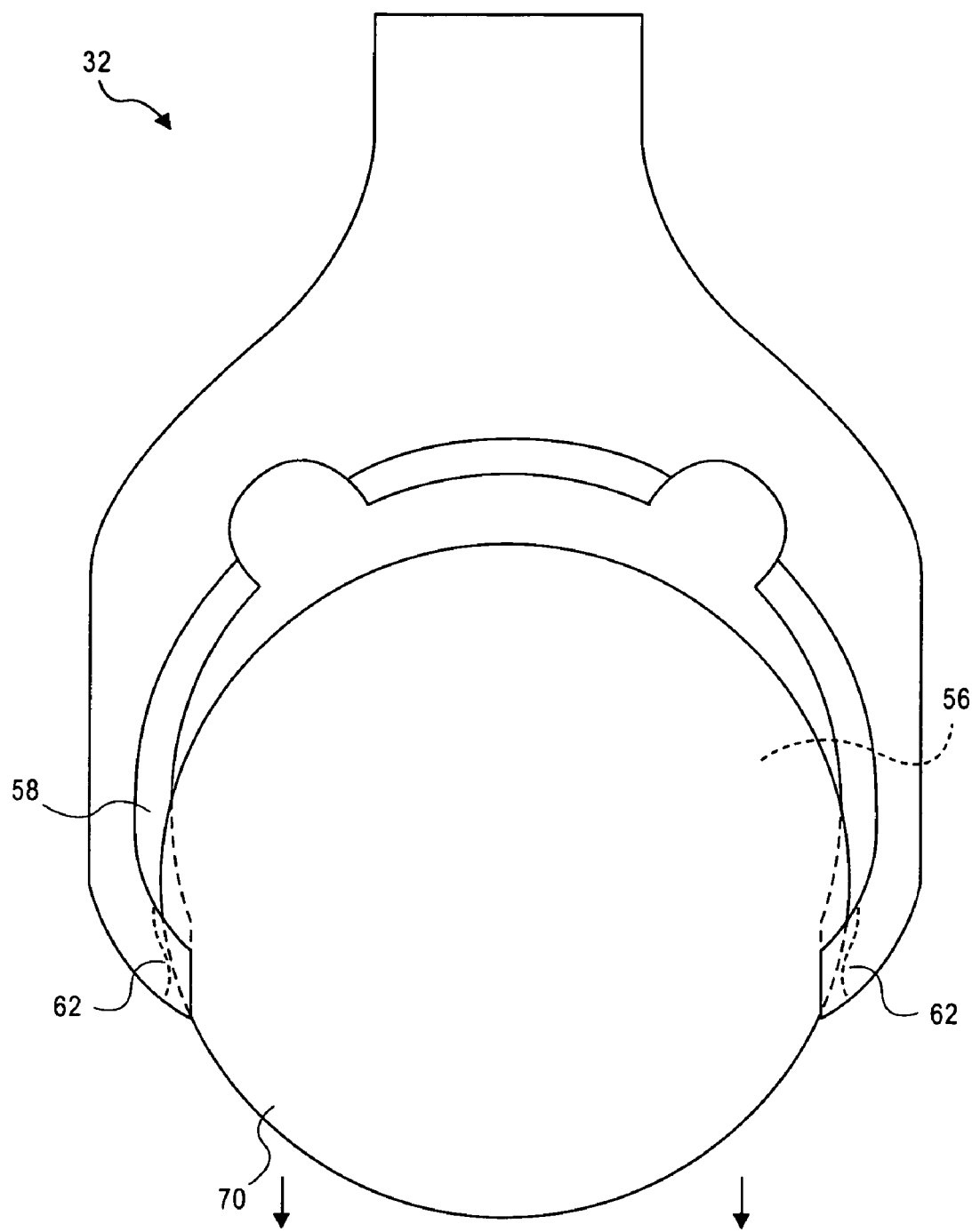
FIG. 6C is a top planned view of the passive substrate gripper with the semiconductor substrate in a second position thereon.

As illustrated in FIG. 6B, the passive gripper 32 may then be rotated, by the module robot 30 illustrated in FIG. 1B, from the horizontal orientation downward into a second, or vertical, angular orientation. Referring to both FIGS. 6B and 6C, as the passive gripper 32 is rotated into the vertical orientation, the substrate 70 may slide within the substrate space 56 along the support ledge 58 and towards the grooves 62 due to the force of gravity. The substrate 70 may contact and be caught by the opposing inner surfaces of the grooves 62, due to the decreased diameter 68 illustrated in FIG. 4A, such that the substrate is in a second, or a "restrained," position between the grooves 62 of the passive gripper 32. Unlike the unrestrained position illustrated in FIG. 6A, while in the restrained position, the substrate may be restricted and held between the upper and lower portions of the grooves 62 of the passive gripper 32 so as to prevent the substrate from being dropped, bumped, or lifted from the passive gripper 32 while in motion. In the example illustrated, in the restrained position, the substrate 70 may not be removed from the passive gripper 32 by moving the substrate in a direction perpendicular to the upper surface of the substrate 70 because of the grooves 62.

Figure 7A:
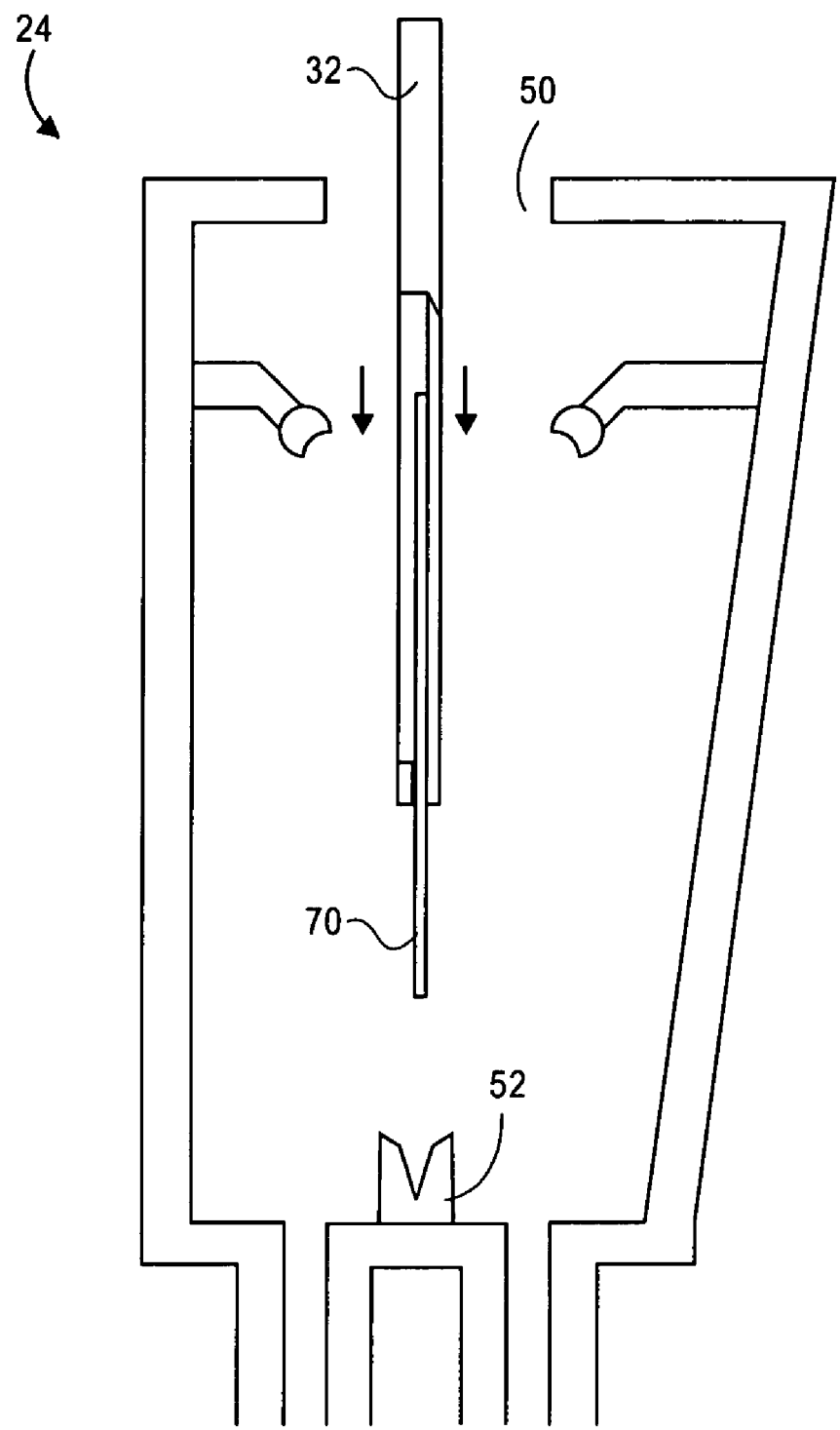
FIGS. 7A-7D are cross-sectional schematic views of the vertical immersion clean chamber of FIG. 3 illustrating the passive substrate gripper placing the semiconductor substrate within the vertical immersion cleaning chamber.
Figure 7B:
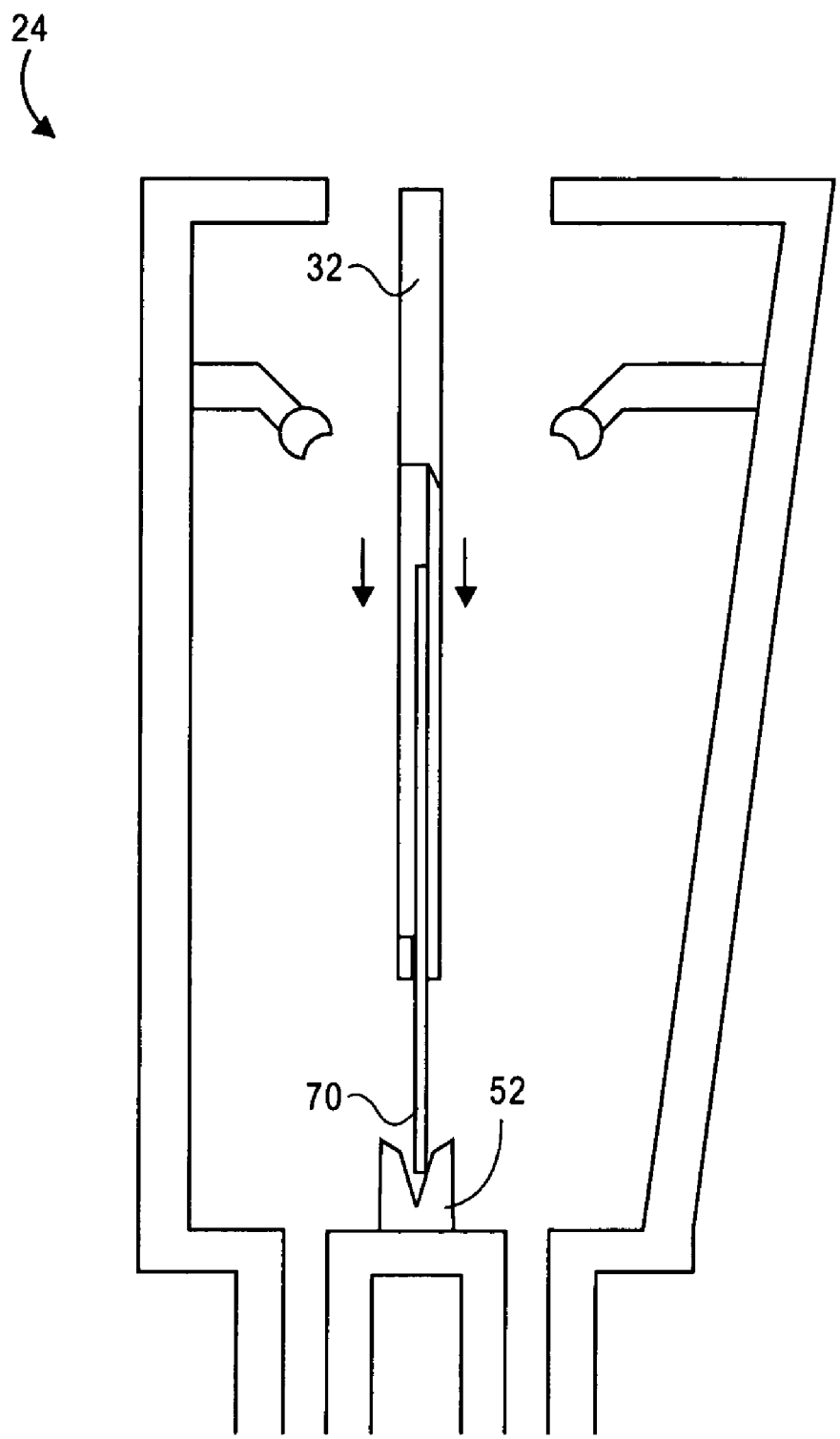
Figure 7C:
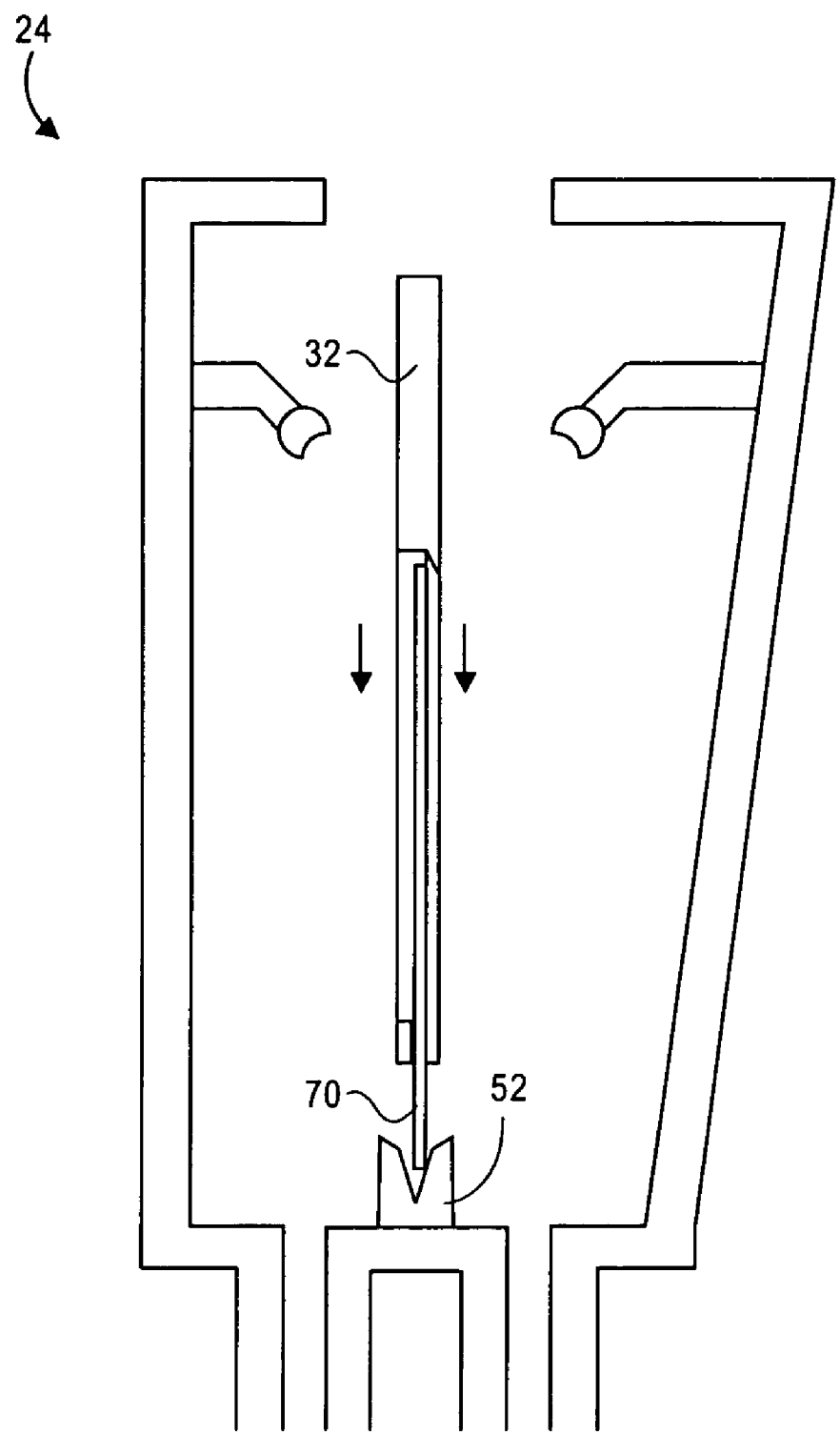

Referring to FIGS. 7A through 7D, the passive gripper 32 may then place the substrate 70 within the vertical immersion clean chamber 24 for further processing. Referring specifically to FIG. 7A, the passive gripper 32 may pass through the substrate opening 50 with the substrate 70 positioned directly over the substrate holder 52. As illustrated in FIGS. 7B and 7C, the passive gripper 32 may place the substrate 70 in the substrate holder 52. The passive gripper 32 may continue to move downward to dislodge the substrate from the restrained position illustrated in FIG. 6C and return the substrate 70 to the unrestrained position illustrated in FIG. 6A.

Figure 7D:
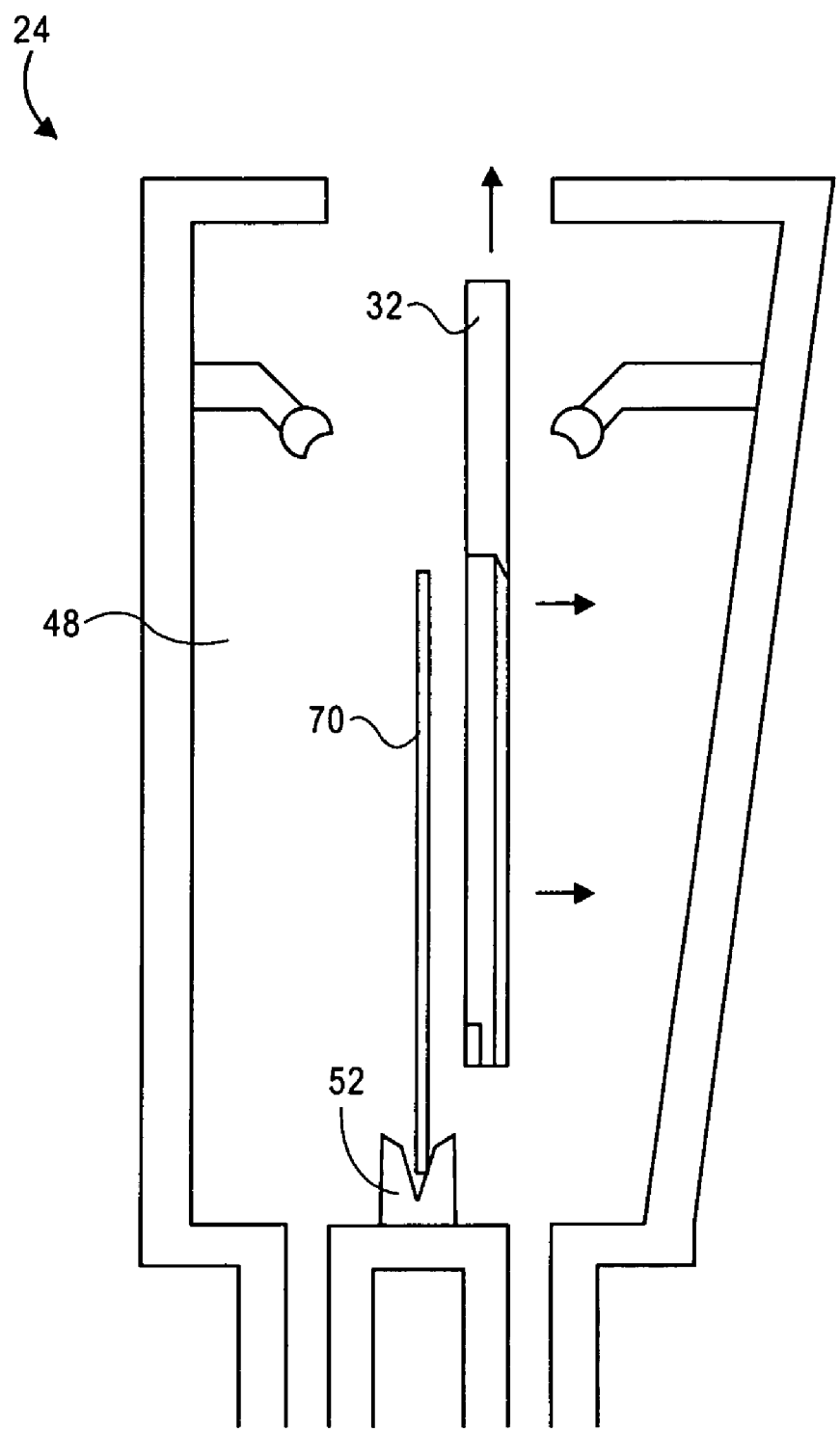
Figure 7E:
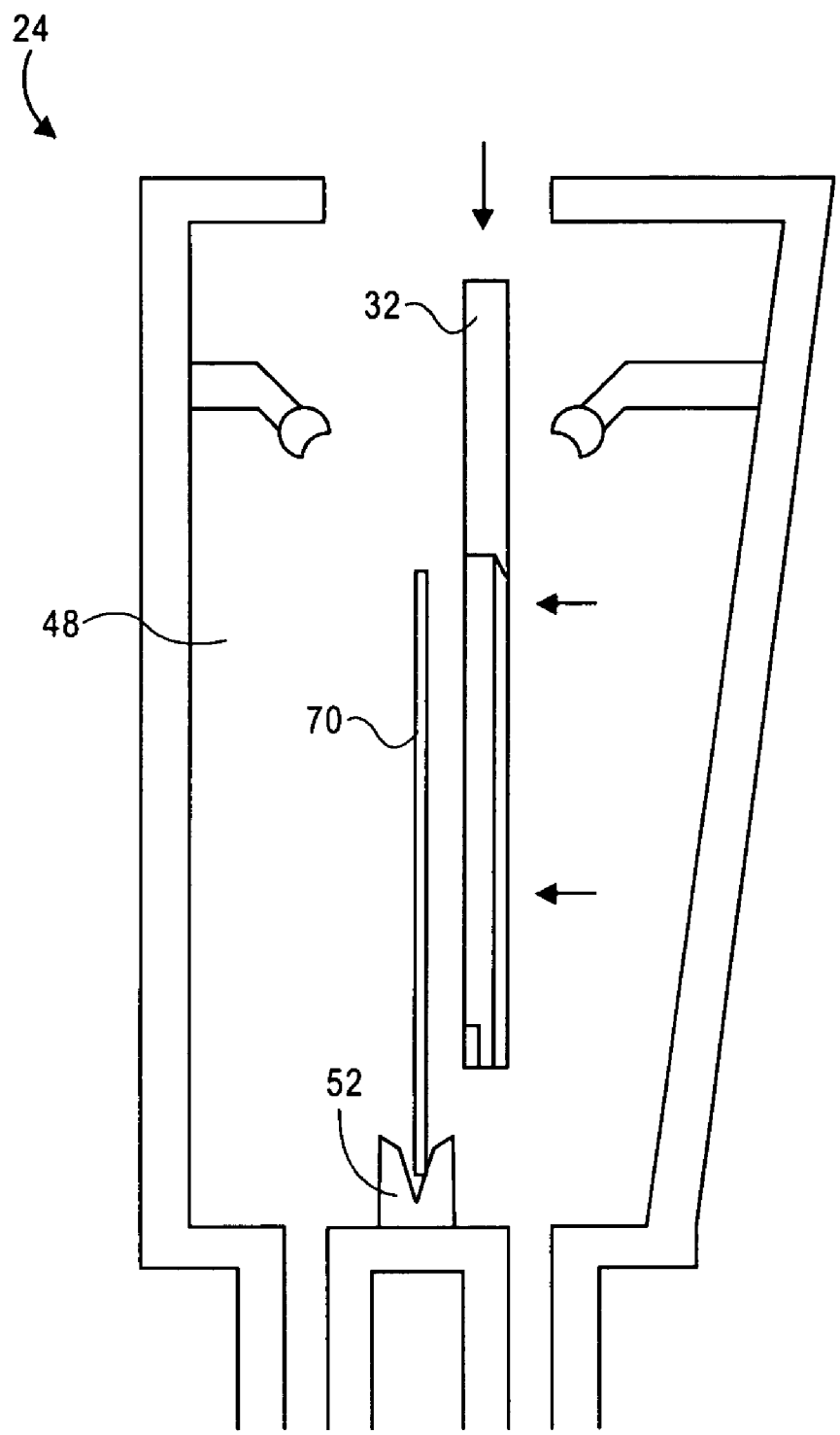
FIGS. 7E-7H illustrate the passive substrate gripper retrieving the semiconductor substrate from the vertical immersion cleaning chamber illustrated in FIG. 3.

Then, as illustrated in FIG. 7D, the passive gripper 32 may then completely remove the substrate 70 by moving towards one of the walls of the vertical immersion clean chamber 24 to thus move the substrate 70 relative to the passive gripper 32 in direction substantially perpendicular to the upper surface of the substrate 70. It should be noted that the substrate 70 may remain in a substantially vertical orientation due to the shape of the substrate holder 52. The passive gripper 32 may then be removed from the vertical immersion clean chamber 34.

Figure 7F:
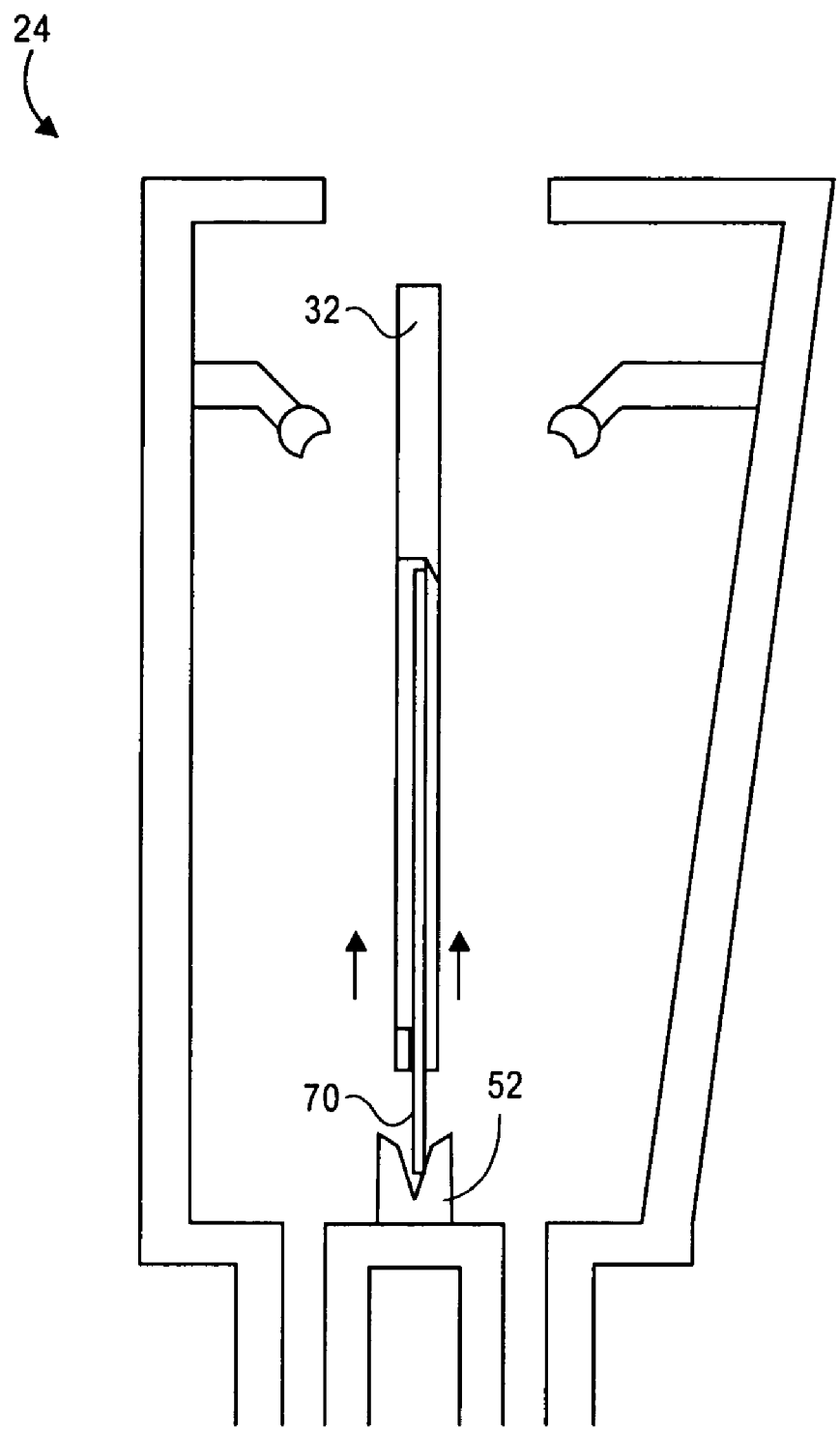
Figure 7G:
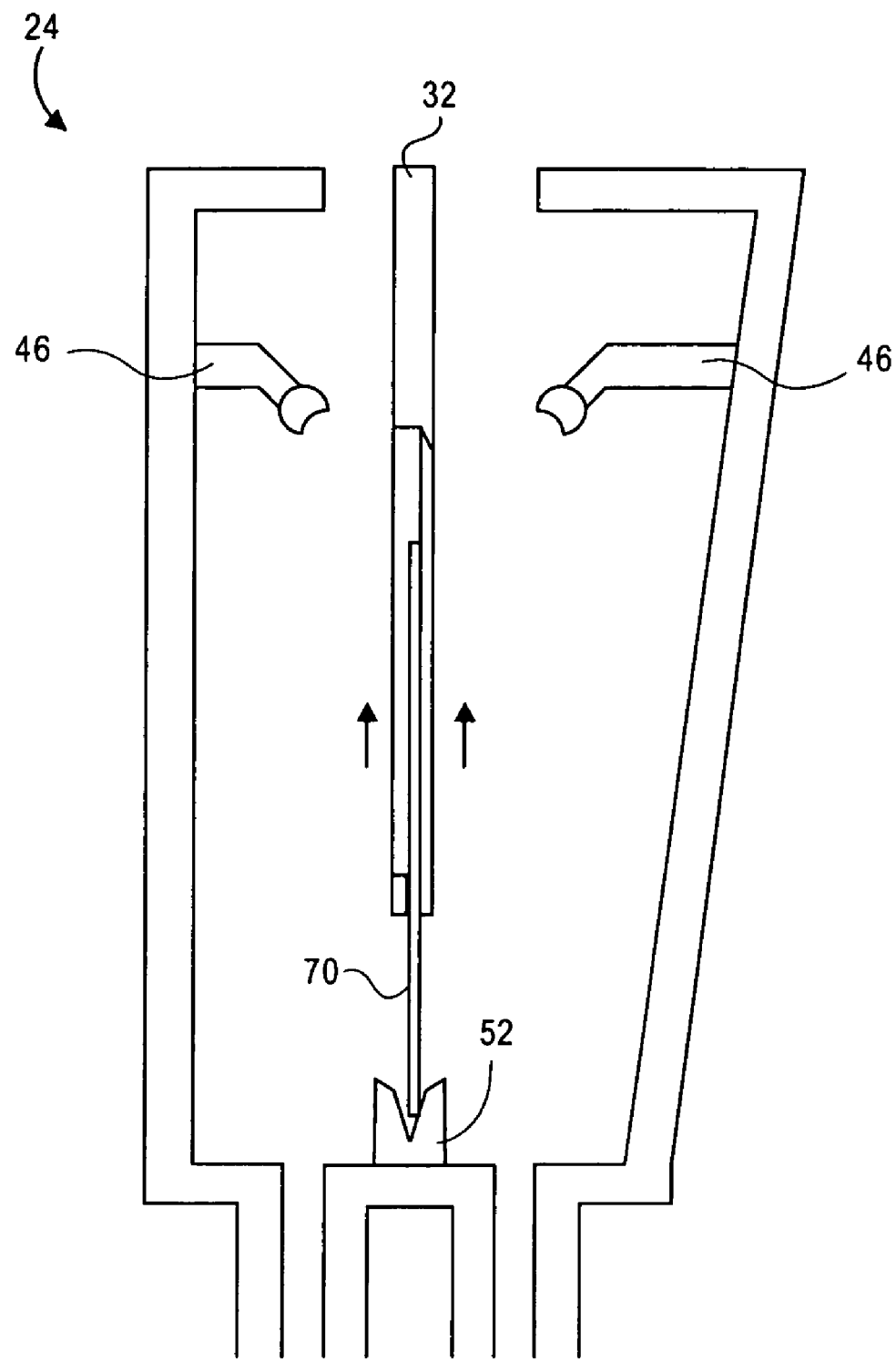
Figure 7H:
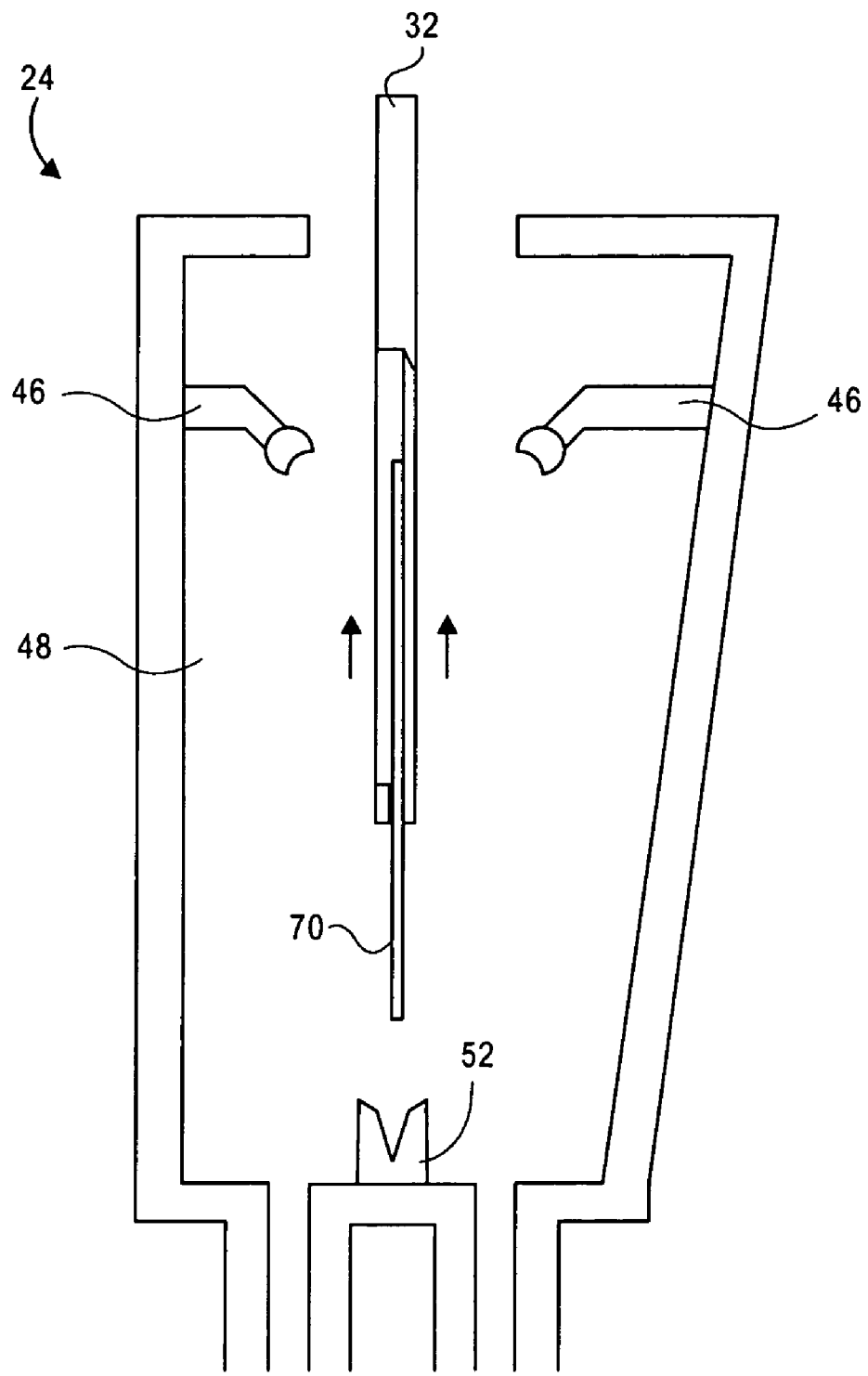

As is commonly understood in the art, various semiconductor processing liquids may then be pumped into the liquid tank of the vertical immersion cleaning chamber 24 to clean the substrate 70. As illustrated in FIGS. 7E-7H, the passive gripper 32 may then remove the substrate 70 from the vertical immersion cleaning chamber 24 using movements opposite of those shown in FIGS. 7A-7D. The passive gripper 32 may be lowered into the vertical immersion cleaning chamber 24 and moved toward the substrate 70 to reposition the substrate 70 into the unrestrained position illustrated in FIG. 6A. As illustrated in FIG. 7F, the passive gripper 32 may then move upwards to catch the substrate 70 and position the substrate 70 in the restrained position illustrated in FIG. 6C. As illustrated in FIGS. 7G and 7H, the passive gripper 32 may then remove the substrate 70 from the vertical immersion cleaning chamber 24 through the opening 50. Although not illustrated, as the substrate 70 is removed from the vertical immersion cleaning chamber 24, the liquid tank 48 may be filled with a semiconductor substrate processing liquid, and a semiconductor substrate processing vapor may be directed from the vapor nozzles 46 on to the substrate 70 as it is removed from the liquid in order to dry the substrate 70.

Figure 8:
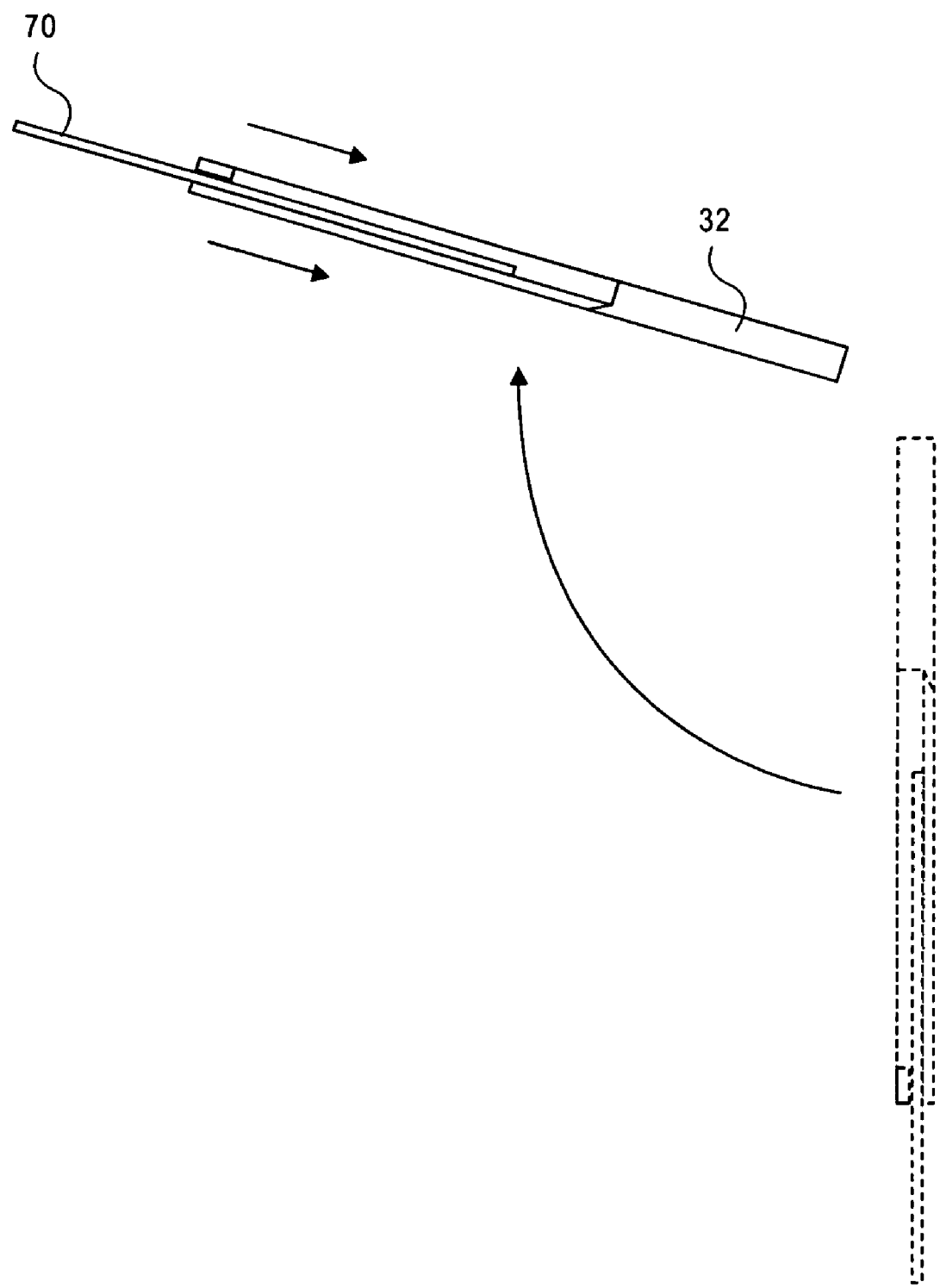
FIG. 8 is a cross-sectional side view of the passive substrate gripper illustrating the rotation thereof from the vertical orientation to an angled orientation.

As illustrated in FIG. 8, after being removed from the vertical immersion cleaning chamber 24, the passive gripper 32 may be rotated from the vertical orientation, passed the horizontal orientation, and into a third angular orientation such that the substrate 70 slides from the restrained position and returns to its unrestrained position as illustrated in FIG. 6A.

Referring again to FIGS. 1A and 1B, the substrate 70 may then be transported back into the spin clean chamber 22. As will be apparent to those skilled in the art, the passive gripper 32 may place the substrate 70 back onto the wafer chuck 38 using movements opposite those illustrated in FIGS. 5A-5C. The transport robot 28 may then retrieve the substrate and return it to one of the substrate cassettes 14.

The transport robot 28 may then retrieve a second substrate from the cassettes 14 to be processed as described above. It should be understood that the processes described above may all be performed substantially simultaneously on different substrates by the different groups of substrate processing modules 18 and module robots 30.

One advantage is that, due to the shape of the passive gripper, the substrate may be transported between the processing modules without contacting the upper and lower surfaces thereof. Thus, the likelihood that the devices being formed on the substrate will be contaminated or damaged during processing is reduced. Another advantage is that because the passive gripper may be made of a single, integral piece of material and include no moving parts, the costs of the transport subsystem, and thus the entire system, is reduced. Therefore, the costs of manufacturing and processing the devices on the substrates is also reduced. A further advantage is that because there are no moving parts, or active end effectors, there are no components on the passive gripper to be damaged by repeated exposure to semiconductor processing.

Other embodiments may utilize the passive gripper in processing systems that include different types of processing modules for different semiconductor substrate processing steps, such as the deposition and removal of various layers. Systems utilizing the passive gripper for substrate cleaning may include different arrangements, numbers, and types of cleaning modules than those described above. The passive gripper may also be sized and shaped to transport substrates from different styles of substrate supports, such as those with a different number of posts (e.g., three posts).

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A passive substrate gripper comprising:
   a first segment comprising a first end and a second end, and a second segment comprising a first end and a second end, the first segment connected to the second segment at the first ends thereof, the first and second segments comprising substrate grooves at the second ends thereof, wherein the first and second segments jointly form a substrate support;
   the substrate support comprising a support ledge extending from opposite inner surfaces of the first and second segments to support a substrate in a first position within the substrate support when the substrate support is in a first angular orientation, the substrate being removable from substrate support in a first direction when in the first position; and
   the opposite inner surfaces of the first and second segments having a first maximum width, and opposing inner surfaces of the substrate grooves having a second maximum width, the first maximum width being greater than the second maximum width to support the substrate in a second position when the substrate support is moved into a second angular orientation, the substrate not being removable in the first direction when in the second position within the substrate support.

2. The passive substrate gripper of claim 1, wherein the first direction is substantially parallel to an upper surface of the substrate when the substrate is in the first position within the substrate support.

3. The passive substrate gripper of claim 2, wherein the substrate contacts the opposing inner surfaces of the substrate grooves when the substrate support is in the second position within the substrate support.

4. The passive substrate gripper of claim 3, wherein each substrate groove has an upper and lower portion, the substrate being positioned between the upper and lower portions when the substrate is in the second position within the substrate support.

5. The passive substrate gripper of claim 4, wherein the first angular orientation is substantially horizontal and the second angular orientation is substantially vertical.

6. The passive substrate gripper of claim 5, wherein the first direction is substantially perpendicular to an upper surface of the substrate.

7. The passive substrate gripper of claim 6, wherein the first and second segments are made from a single, integral piece of material.

8. A semiconductor substrate processing system comprising:
   a frame;
   a first semiconductor substrate support connected to the frame to support a semiconductor substrate; and
   a semiconductor substrate transport mechanism moveably connected to the frame including a passive substrate gripper, the passive substrate gripper having a first segment comprising a first end and a second end, and a second segment comprising a first end and a second end, the first segment connected to the second segment at the first ends thereof, the first and second segments comprising substrate grooves at the second ends thereof, wherein the first and second segments jointly form a second semiconductor substrate support;
   the second semiconductor substrate support comprising a support ledge extending from opposite inner surfaces of the first and second segments to support a semiconductor substrate in a first position within the second semiconductor substrate support when the second semiconductor substrate support is in a first angular orientation, the semiconductor substrate being removable from second semiconductor substrate support in a first direction when in the first position; and
   the opposite inner surfaces of the first and second segments having a first maximum width, and opposing inner surfaces of the substrates grooves having a second maximum width, the first maximum width being greater than the second maximum width to support the substrate in a second position when the second semiconductor substrate support is moved into a second angular orientation, the semiconductor substrate not being removable in the first direction when in the second position within the second semiconductor substrate support.

9. The semiconductor substrate processing system of claim 8, further comprising:
   a first semiconductor substrate processing module connected to the frame, the first semiconductor substrate support being positioned within the first semiconductor substrate processing module; and
   a second semiconductor substrate processing module connected to the frame, wherein the semiconductor substrate transport mechanism is connected to the frame to move the passive substrate gripper between the first and second semiconductor substrate processing modules.

10. The semiconductor substrate processing system of claim 8, wherein the substrate contacts the opposing inner surfaces of the substrate grooves when the substrate support is in the second position within the substrate support and wherein each substrate groove has an upper and lower portion, the substrate being positioned between the upper and lower portions when the substrate is in the second position within the substrate support.

11. A method comprising:
supporting a semiconductor substrate in a first position on a semiconductor substrate support in a first angular orientation, the semiconductor substrate being removable from the semiconductor substrate support in a first direction relative to the semiconductor substrate; and
rotating the semiconductor substrate support to a second angular orientation, the semiconductor substrate support being shaped such that during said rotation the semiconductor substrate moves into a second position on the semiconductor substrate support and the semiconductor substrate is not removable from the semiconductor substrate support in the first direction relative to the semiconductor substrate.

12. The method of claim 11, further comprising:
transporting the semiconductor substrate from a first semiconductor substrate processing module to a second semiconductor processing module;
moving the semiconductor substrate into the first position on the semiconductor substrate support while the semiconductor substrate support is in the second angular orientation;
moving the semiconductor substrate relative to semiconductor substrate support in the first direction while the semiconductor substrate support is in the second angular orientation; and
removing the semiconductor substrate from the semiconductor substrate support.

13. The method of claim 12, further comprising:
positioning the semiconductor substrate support, in the first angular orientation, below the semiconductor substrate while the semiconductor substrate is on a second semiconductor substrate support;
moving the semiconductor substrate support upwards to position the semiconductor substrate on the semiconductor substrate support in the first position; and
lifting the semiconductor substrate from the second semiconductor substrate support.

14. The method of claim 13, wherein the semiconductor substrate support comprises first and second segments connected at first ends thereof, the first and second segments including substrate grooves at second ends thereof, and wherein the semiconductor substrate support is made from a single, integral piece of material.

15. The method of claim 14, wherein the opposing inner surfaces of the first and second segments of the semiconductor substrate support have a first maximum width and opposing inner surfaces of the substrate grooves have a second maximum width, the first maximum width being greater than the second maximum width.

* * * * *